US010535535B2

(12) United States Patent
Marchisi

(10) Patent No.: US 10,535,535 B2
(45) Date of Patent: Jan. 14, 2020

(54) SEMICONDUCTOR PRODUCT AND CORRESPONDING METHOD

(71) Applicant: STMicroelectronics S.r.l., Agrate Brianza (IT)

(72) Inventor: Fabio Marchisi, Milan (IT)

(73) Assignee: STMICROELECTRONICS S.R.L., Agrate Brianza (IT)

(*) Notice: Subject to any disclaimer, the term of this patent is extended or adjusted under 35 U.S.C. 154(b) by 0 days.

(21) Appl. No.: 16/020,757

(22) Filed: Jun. 27, 2018

(65) Prior Publication Data
US 2019/0006191 A1    Jan. 3, 2019

(30) Foreign Application Priority Data

Jun. 30, 2017    (IT) .................... 102017735O1

(51) Int. Cl.
H01L 21/48        (2006.01)
H01L 21/56        (2006.01)
(Continued)

(52) U.S. Cl.
CPC .......... H01L 21/486 (2013.01); H01L 21/563 (2013.01); H01L 23/3677 (2013.01); H01L 23/49827 (2013.01); H01L 24/48 (2013.01); H01L 24/81 (2013.01); H01L 24/85 (2013.01); H01L 2224/48227 (2013.01); H01L 2224/73265 (2013.01); H01L 2225/1058 (2013.01)

(58) Field of Classification Search
CPC ............... H01L 21/4846; H01L 21/486; H01L 23/49827; H01L 21/563; H01L 23/3677; H01L 24/48; H01L 24/81; H01L 24/85
See application file for complete search history.

(56) References Cited

U.S. PATENT DOCUMENTS 5,174,766 A * 12/1992 Yoshizawa ............. H05K 3/321
                                                         439/91
5,260,518 A * 11/1993 Tanaka ................. H01L 21/4853
                                                         174/255

(Continued)

FOREIGN PATENT DOCUMENTS

EP    0582052 A1    2/1994
EP    1150351 A2   10/2001
JP    2002-76055 A   3/2002

OTHER PUBLICATIONS

"Products/Service", Hakodate Electronics Co., Ltd., retrieved from http://www.hakoden.co.jp/process/index-en.html on Jun. 26, 2017, 4 pages.

(Continued)

Primary Examiner — David A Zarneke
(74) Attorney, Agent, or Firm — Seed Intellectual Property Law Group LLP

(57) ABSTRACT

A semiconductor product such as an integrated circuit includes a laminar plastic substrate having first and second opposed surfaces and through holes extending through the substrate, electrically and/or thermally conductive material balls inserted in the through holes at the first surface of the substrate, and one or more semiconductor chips mounted at the first surface of the substrate, the semiconductor chip(s) electrically and/or thermally coupled with electrically and/or thermally conductive material balls inserted in the through holes.

20 Claims, 9 Drawing Sheets

(51) Int. Cl.
*H01L 23/367* (2006.01)
*H01L 23/498* (2006.01)
*H01L 23/00* (2006.01)

(56) References Cited

U.S. PATENT DOCUMENTS

| | | | | |
|---|---|---|---|---|
| 5,418,510 | A * | 5/1995 | Gray | H01P 1/2082 333/208 |
| 5,509,203 | A * | 4/1996 | Yamashita | G01R 1/07314 228/56.3 |
| 5,600,884 | A * | 2/1997 | Kondo | H01L 21/486 156/307.3 |
| 5,849,609 | A * | 12/1998 | Chun | H01L 23/3128 438/125 |
| 5,929,522 | A | 7/1999 | Weber | |
| 6,022,761 | A * | 2/2000 | Grupen-Shemansky | H01L 23/49827 257/E21.511 |
| 6,037,665 | A * | 3/2000 | Miyazaki | H01L 23/49827 257/773 |
| 6,080,936 | A * | 6/2000 | Yamasaki | H01R 43/0235 174/260 |
| 6,148,900 | A * | 11/2000 | Yamasaki | H01R 43/0235 164/80 |
| 6,191,370 | B1 * | 2/2001 | Oh | H01L 23/49816 174/260 |
| 6,271,482 | B1 * | 8/2001 | Crotzer | H01H 1/029 174/262 |
| 6,372,549 | B2 | 4/2002 | Urushima | |
| 6,376,279 | B1 * | 4/2002 | Kwon | H01L 23/3114 257/772 |
| 6,444,924 | B1 * | 9/2002 | Ishida | H01L 23/49816 174/260 |
| 6,522,017 | B2 * | 2/2003 | Horiuchi | H01L 21/563 257/737 |
| 6,574,113 | B2 * | 6/2003 | Armezzani | H01L 23/49816 174/260 |
| 6,709,964 | B2 * | 3/2004 | Lee | H01L 23/49827 257/737 |
| 6,768,064 | B2 * | 7/2004 | Higuchi | H05K 3/4069 174/258 |
| 7,205,178 | B2 * | 4/2007 | Shiu | H01L 21/56 257/723 |
| 7,263,769 | B2 * | 9/2007 | Morimoto | H05K 3/4046 228/180.1 |
| 7,304,247 | B2 * | 12/2007 | Birgel | H05K 1/114 174/254 |
| 7,442,641 | B2 * | 10/2008 | Beatson | H01L 21/486 257/773 |
| 7,989,947 | B2 * | 8/2011 | Otani | H01L 21/565 257/706 |
| 8,307,532 | B2 * | 11/2012 | Egami | F01N 13/008 204/424 |
| 8,716,041 | B2 * | 5/2014 | Doan | H01L 33/62 257/E33.058 |
| 8,940,629 | B2 * | 1/2015 | Kimura | H01L 21/565 438/106 |
| 9,048,332 | B2 * | 6/2015 | Kurashina | H01L 24/81 |
| 9,171,739 | B1 * | 10/2015 | Roh | H01L 23/145 |
| 9,245,864 | B2 * | 1/2016 | Kimura | H01L 21/565 |
| 9,330,994 | B2 * | 5/2016 | Camacho | H01L 21/56 |
| 9,536,845 | B2 * | 1/2017 | Lamy | H01Q 1/2283 |
| 9,620,464 | B2 * | 4/2017 | Baks | H01L 23/49827 |
| 9,646,854 | B2 * | 5/2017 | Li | H01L 23/49822 |
| 9,711,376 | B2 * | 7/2017 | Cheung | C25D 7/12 |
| 9,935,026 | B2 * | 4/2018 | Anderson | H01L 23/49838 |
| 10,037,945 | B2 * | 7/2018 | Huang | H01L 23/481 |
| 10,037,948 | B2 * | 7/2018 | Sommer | H01L 23/552 |
| 2002/0102745 | A1 * | 8/2002 | Lahiri | H01L 21/485 438/4 |
| 2003/0062631 | A1 * | 4/2003 | Nemoto | H01L 21/568 257/787 |
| 2005/0095356 | A1 * | 5/2005 | Nakamura | H01L 21/288 427/58 |
| 2006/0278997 | A1 * | 12/2006 | Gibson | H01L 23/49827 257/778 |
| 2008/0032457 | A1 * | 2/2008 | McWilliams | B81C 1/00293 438/125 |
| 2009/0044405 | A1 * | 2/2009 | Hougham | H01L 23/49827 29/874 |
| 2009/0117336 | A1 * | 5/2009 | Usui | H01L 21/486 428/172 |
| 2010/0019370 | A1 | 1/2010 | Pressel et al. | |
| 2012/0068340 | A1 | 3/2012 | Kimura | |
| 2012/0134631 | A1 * | 5/2012 | Chiang | B29C 45/0013 385/88 |
| 2013/0249073 | A1 | 9/2013 | Chen et al. | |
| 2013/0256885 | A1 * | 10/2013 | Warren | H01L 24/14 257/738 |
| 2015/0279778 | A1 * | 10/2015 | Camacho | H01L 21/56 257/737 |
| 2018/0096975 | A1 * | 4/2018 | Hua | H01L 21/4853 |
| 2018/0115356 | A1 * | 4/2018 | Jain | H05K 1/0206 |
| 2019/0259629 | A1 * | 8/2019 | Ziglioli | H01L 21/4821 |

OTHER PUBLICATIONS

Zhang et al., "Flexible Electronics: Thin Silicon Die on Flexible Substrates", *IEEE Transactions on Electronics Packaging Manufacturing*, vol. 32, No. 4, Oct. 2009, pp. 291-300.

* cited by examiner

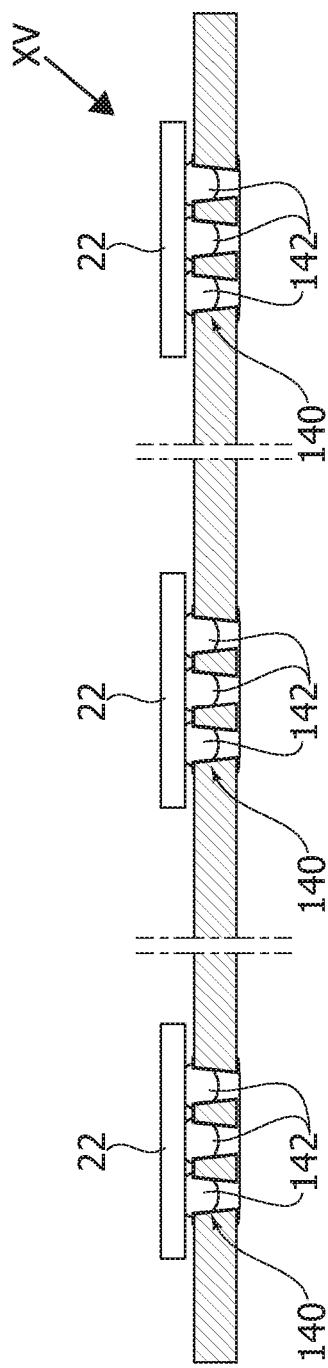
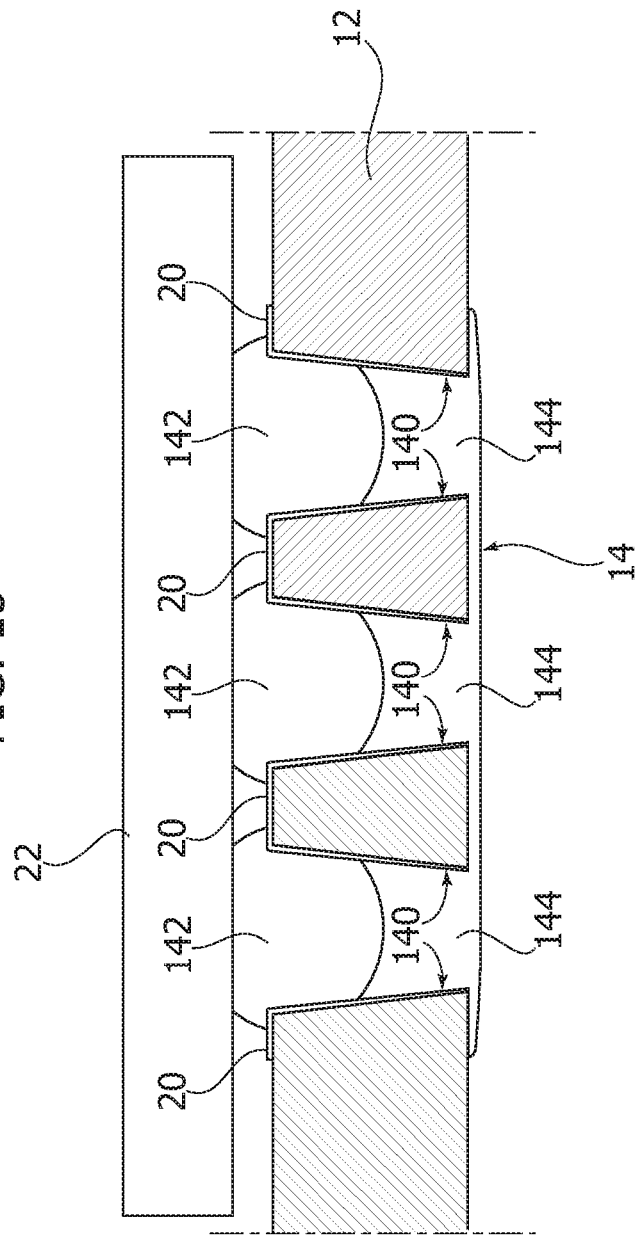

SEMICONDUCTOR PRODUCT AND CORRESPONDING METHOD

BACKGROUND

Technical Field

The description relates to semiconductor products.

Description of the Related Art

The cost of lead frame and substrate materials may affect the cost of packaged semiconductor products. For instance, the use of pre-plated lead frames or substrate may have an undesired impact on the cost of the final device.

Also, the use of a metallic frame or a dedicated substrate may have a negative effect on the design options available to a manufacturer of semiconductor products (for instance an IC manufacturer).

Additionally, technologies such as electro-less/electro-plating of, e.g., copper may lead to a high consumption of chemicals and to an increase in the duration of the manufacturing process.

BRIEF SUMMARY

One or more embodiments may relate to a semiconductor product (or package) and a corresponding method. One or more embodiments may be applied to semiconductor products for use, e.g., in the automotive field. Low-cost automotive-grade packaged semiconductor products, such as integrated circuits for signal and power (e.g., high-current) applications, are exemplary of such products.

The claims are an integral part of the technical disclosure of embodiments as provided herein.

In one or more embodiments, a lead frame may be replaced by a substrate with metallized (e.g., conical) vias and routing obtained through laser ablation and electro-less plating plus electroplating.

In one or more embodiments, via holes may be partially filled by balls forced into the via holes.

In one or more embodiments the "stud bumps" thus formed may prevent resin from leaking out during package molding while also reducing the time and cost of completing vias filling in order to produce external pins.

BRIEF DESCRIPTION OF THE SEVERAL VIEWS OF THE DRAWINGS

One or more embodiments will now be described, by way of example only, with reference to the annexed figures, wherein:

FIG. 14 is a partial cross-sectional view of the substrate of FIG. 13 along line XIV-XIV of FIG. 13 at a stage in assembly of a semiconductor package, and FIG. 15 is an enlarged view corresponding to the portion of FIG. 14 indicated by arrow XV.

It will be appreciated that, for the sake of simplicity and understanding, the various figures may not be drawn to a same scale.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

By way of background, one may note that T. Zhang, et al. "Flexible Electronics: Thin Silicon Die on Flexible Substrates," IEEE TRANSACTIONS ON ELECTRONICS PACKAGING MANUFACTURING, VOL. 32, NO. 4, OCTOBER 2009, pp. 291-300 propose options (solder bumps or gold stud bumps) where bumps connected to die pads are bonded to pre-existing bond fingers obtained by electro-deposition on an LCP substrate. The side walls of these vias do not play any role in providing a passageway for the bumps.

Somewhat similar arrangements are proposed by Hakodate Electronics at http://www.hakoden.co.jp/process/index-en.html in connection with a flip-chip solution including bumps.

In both instances, the bumps embedded in the substrate are affected by the different expansion of the substrate and silicon with stress arising between the ball joint and the device pad.

Figure 2:
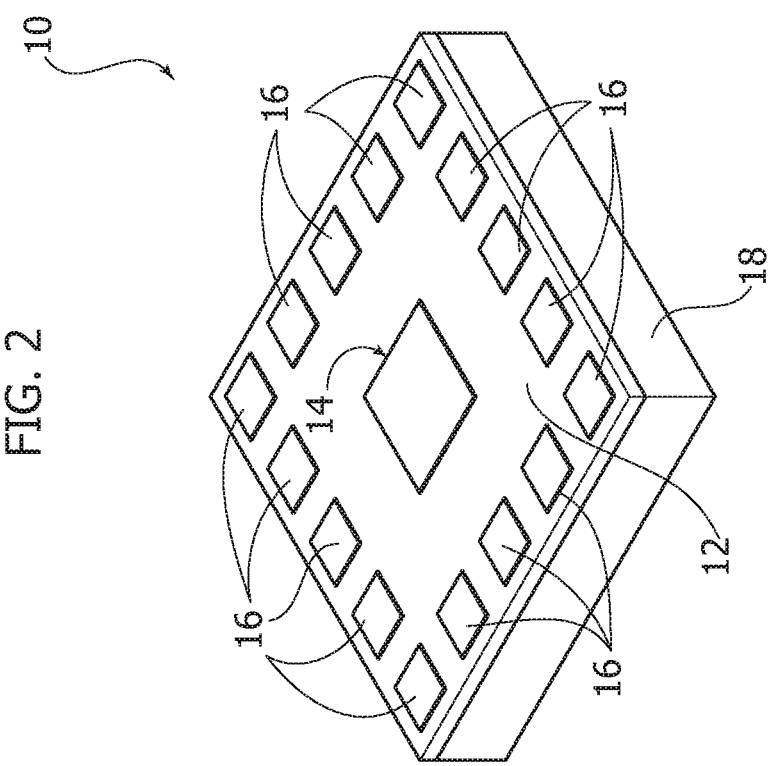
FIGS. 1 and 2 are perspective top and bottom views of a semiconductor package according to one embodiment.
Figure 1:
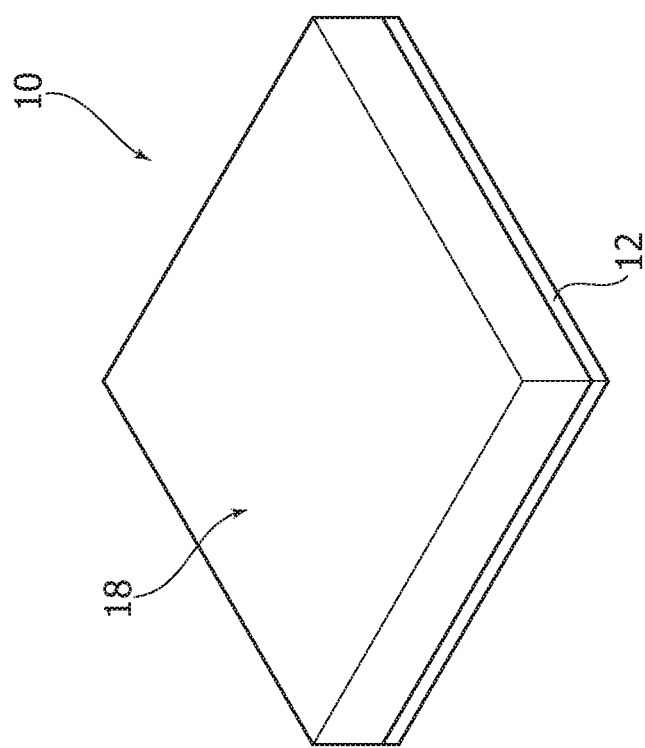

In FIGS. 1 and 2 reference number 10 indicates as a whole a semiconductor product of a packaged type, also referred to as a semiconductor package, as seen from approximately opposite view points (e.g., "top" in FIG. 1 and "bottom" in FIG. 2).

The product 10 as exemplified herein may be regarded as similar to QFN (Quad Flat No-Lead) package comprising a semiconductor die with one or more integrated circuits, wherein the package does not involve the use of a dedicated metallic frame.

In one or more embodiments as exemplified herein, the product 10 includes a substrate 12 provided at its bottom or back face with an (e.g., central) heat sink 14 and a plurality of (e.g., peripheral) contact pads or lands 16 distributed around the substrate 12.

In one or more embodiments as exemplified herein, the product 10 includes a package 18 of a package molding compound such as an epoxy molding compound—EMC.

In one or more embodiments as exemplified herein, the substrate 12 (intended to act as a substitute for a metallic frame, such as a lead frame) includes plastic material such as, e.g., a resin including a filler.

In one or more embodiments as exemplified herein, the substrate 12 may include one or more materials adapted for laser direct structuring (LDS) processing. In particular, the substrate 12 may be a polymer with electrically isolated nanoparticles dispersed therein as exemplary of such material, with laser beam processing (laser ablation) of such a material adapted to make the nanoparticles conductive.

In one or more embodiments as exemplified herein, the possibility exists of applying, e.g., electroless plating, one or more conductive materials in order to create electrically conductive (surface) areas on the substrate 12 with the capability of possibly increasing the thickness of the electrically-conductive formations (tracks or traces) thus produced, e.g., via electrolytic plating.

Figure 3:
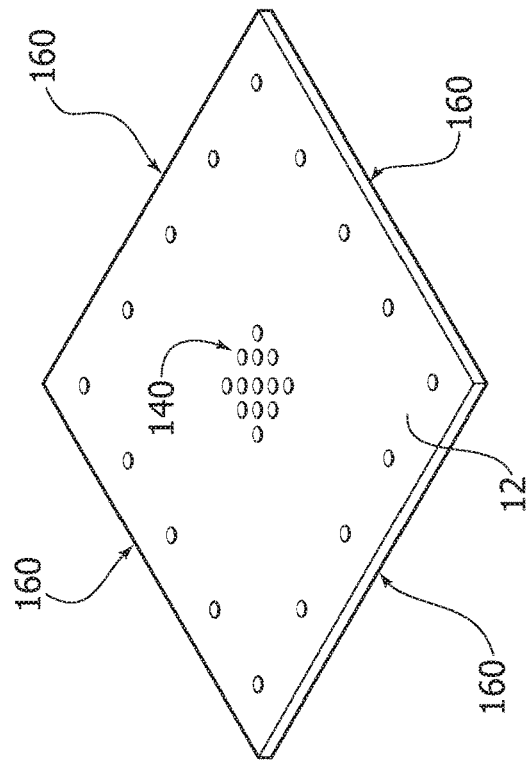

FIG. 3 is exemplary of the possibility of providing an, e.g., quadrangular substrate 12 as discussed herein with a first set of (through) holes 140 (e.g., centrally of the substrate 12) and a second set of (through) holes 160 (e.g., in the form of linear arrays of holes extending along the sides of the substrate 12 or at the perimeter of the substrate 12). The substrate 12 includes a top or front surface, which faces upward in FIG. 3, and a bottom or back surface (not shown) and is made from an insulative material.

Figure 4:
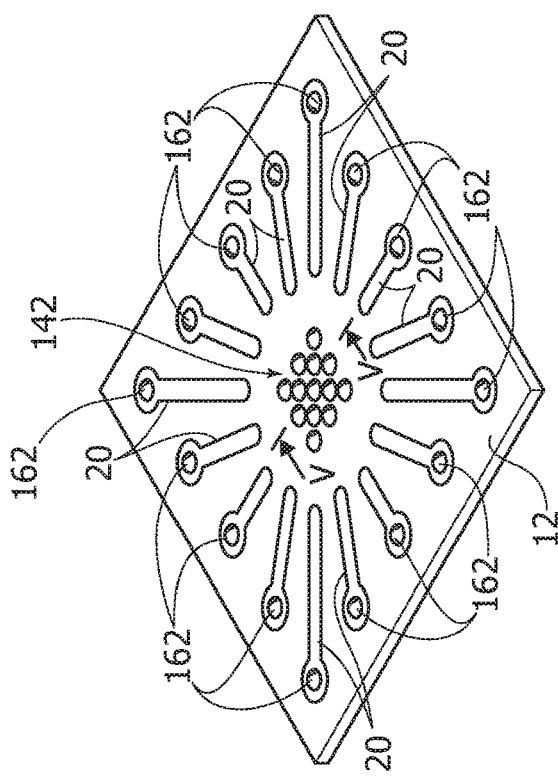
FIGS. 3 to 8 are exemplary perspective views of various possible stages of manufacturing the semiconductor package of FIG. 1, with FIG. 5 being an enlarged perspective view essentially along line V-V of FIG. 4.

FIG. 4 is exemplary of the possibility of applying to a substrate 12 as shown in FIG. 3 various processing steps (including, e.g., metallization and bumping as discussed in the following) in order to create signal and/or thermal vias therethrough.

Figure 5:
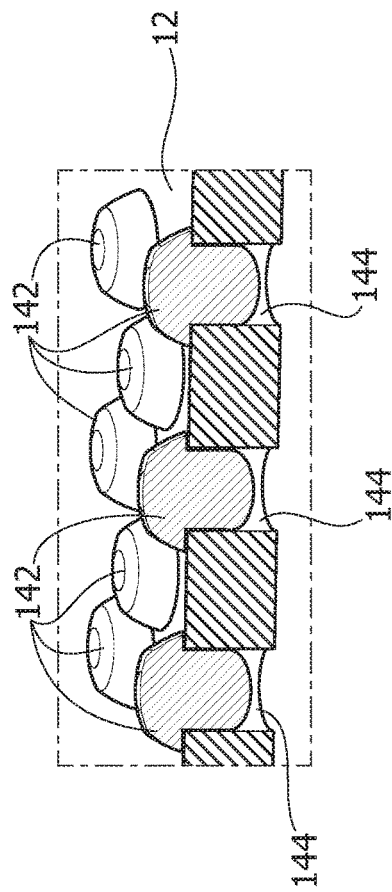

FIG. 5 (which is an enlarged perspective view essentially along line V-V of FIG. 4) shows the details of such bumping (e.g., balls 142 inserted into the holes 140 at the top or front surface of the substrate 12) and thermal vias at the central portion of the substrate 12. FIG. 5 also highlights the possible presence of empty volumes or spaces 144 at the bottom or back surface of the substrate 12 which can be filled, e.g., by electroplating material as discussed in the following in order to provide the heat sink 14.

In one or more embodiments, the holes 140, 160 can be produced by laser beam drilling of the substrate 12.

In one or more embodiments, using an LDS material for the substrate leads to the holes 140, 160 having electrically (and thermally) conductive inner surfaces due to the action of laser beam.

In one or more embodiments, the holes 140, 160 are adapted to be processed by depositing an electrically conductive material (e.g., copper) thus forming electrically (and thermally) vias through the substrate 12.

In one or more embodiments, the holes 140, 160 are adapted to be at least partially filled by inserting electrically and/or thermally conductive (e.g., copper) balls 142, 162 to produce conductive stud bumps so that electrical current or heat (or both) can propagate through the substrate 12.

In one or more embodiments, the balls 142, 162 can be forced into the (metallized) holes forming the vias thus being retained therein by mechanical interference.

In one or more embodiments, the holes 140, 160 may exhibit a (frusto)conical shape, e.g., tapering from the front or top surface to the back or bottom surface of the substrate 12. This facilitates introducing the balls 142, 162 into the holes 140, 160 with the resulting stud bumps acting as a sort of "plug" at least partially filling the holes 140, 160 (at the front surface of the substrate 12). This reduces the volume and thus the amount of material (e.g., electrolytic copper) to be deposited into the remaining spaces (see, e.g., 144 in FIG. 5) to fill the resulting electrical/thermal vias.

Figure 6:
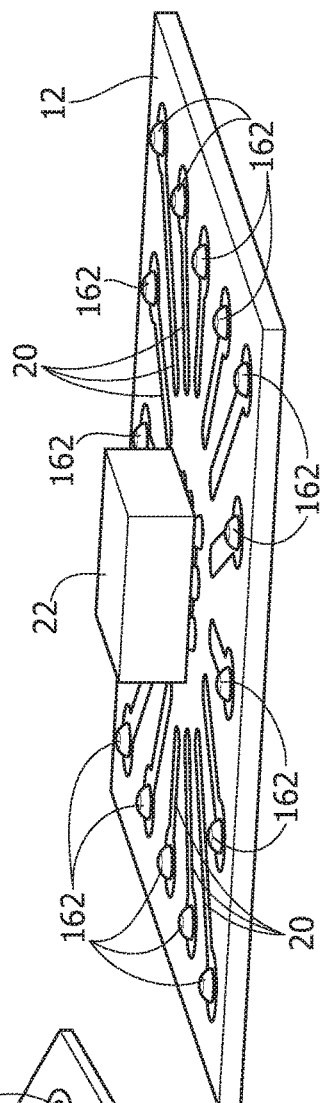
Figure 7:
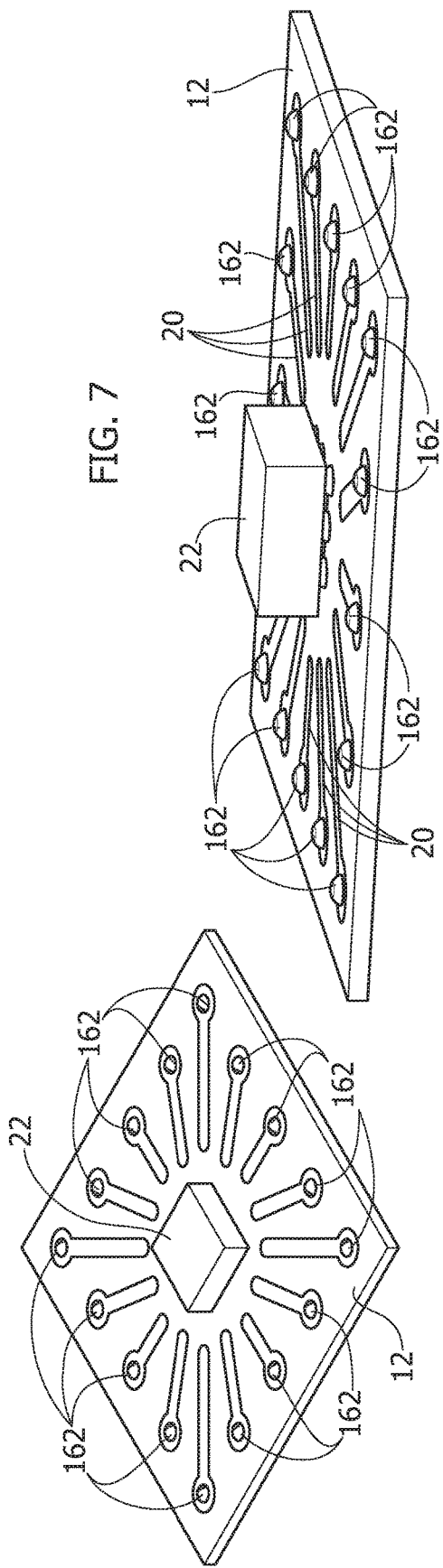
Figure 8:
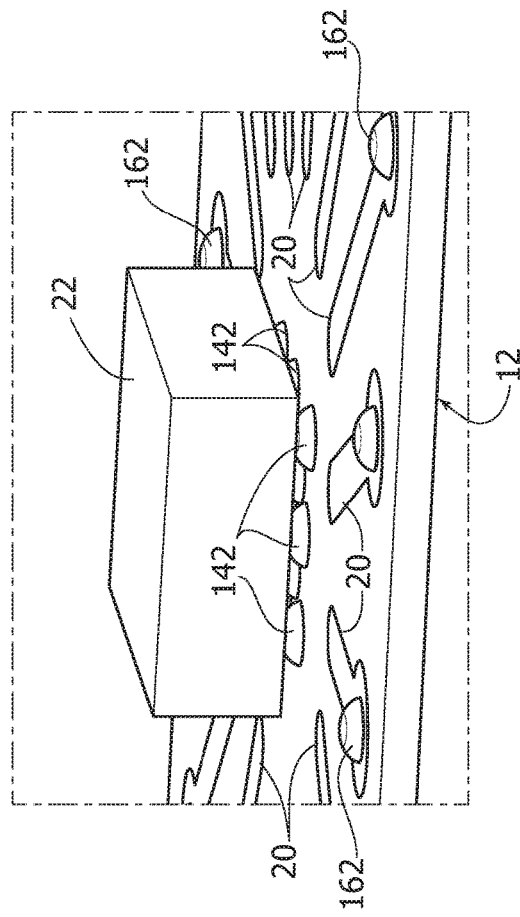

FIGS. 6 to 8 are exemplary of a semiconductor die or chip 22 mounted (e.g., attached by known means, such as by tape, adhesive, glue, etc.) onto the substrate 12 e.g., at the central portion where the holes 140 and the balls/bumps 142 have been provided.

The bumps 142 may thus facilitate heat dissipation from the chip or die 22 through the bumps 142 and the (metallized) holes 140 and on to the heat sink 14, which is formed by filling (e.g., via electroplating) the spaces 144 at the bottom or back surface of the substrate with a conductive material and may include adding portions of the conductive material onto the bottom or back surface of the substrate 12 between the holes.

Also, in one or more embodiments the electrically-conductive formations (tracks or traces) 20 will extend radially inwardly from the peripheral spheres/bumps 162 towards the semiconductor chip or die 22.

Figure 9:
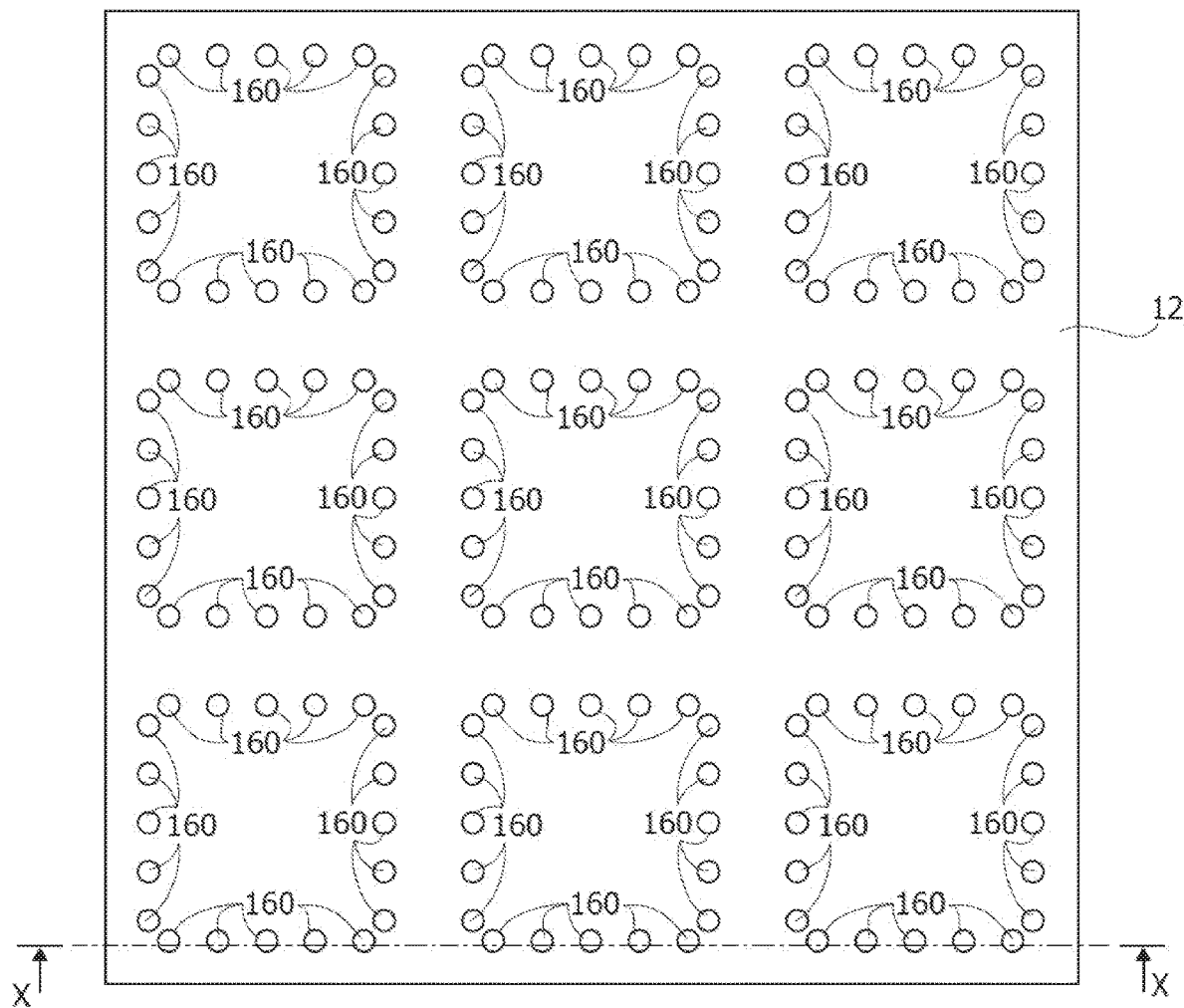
FIG. 9 is a plan view of a substrate in accordance with one embodiment, FIG. 10 includes six portions, designated a), b), c), d), e) and f), exemplary of possible steps of assembling a semiconductor package using the substrate of FIG. 9 according to one embodiment and represented in cross-sectional views substantially corresponding to line X-X of FIG. 9.

Figures from FIG. 9 onwards are exemplary of various options which may be adopted in implementing the steps exemplified in FIGS. 3 to 8 while also illustrating possible subsequent steps in one or more embodiments.

Also, figures from FIG. 9 onwards are exemplary of the possibility of using substrates 12 having hole/via layouts different from those exemplified previously.

For instance, FIG. 9 exemplifies the possibility of using a substrate 12 including a matrix-like (e.g., 3×3) arrangement of approximately square patterns of holes 160.

Figure 10:
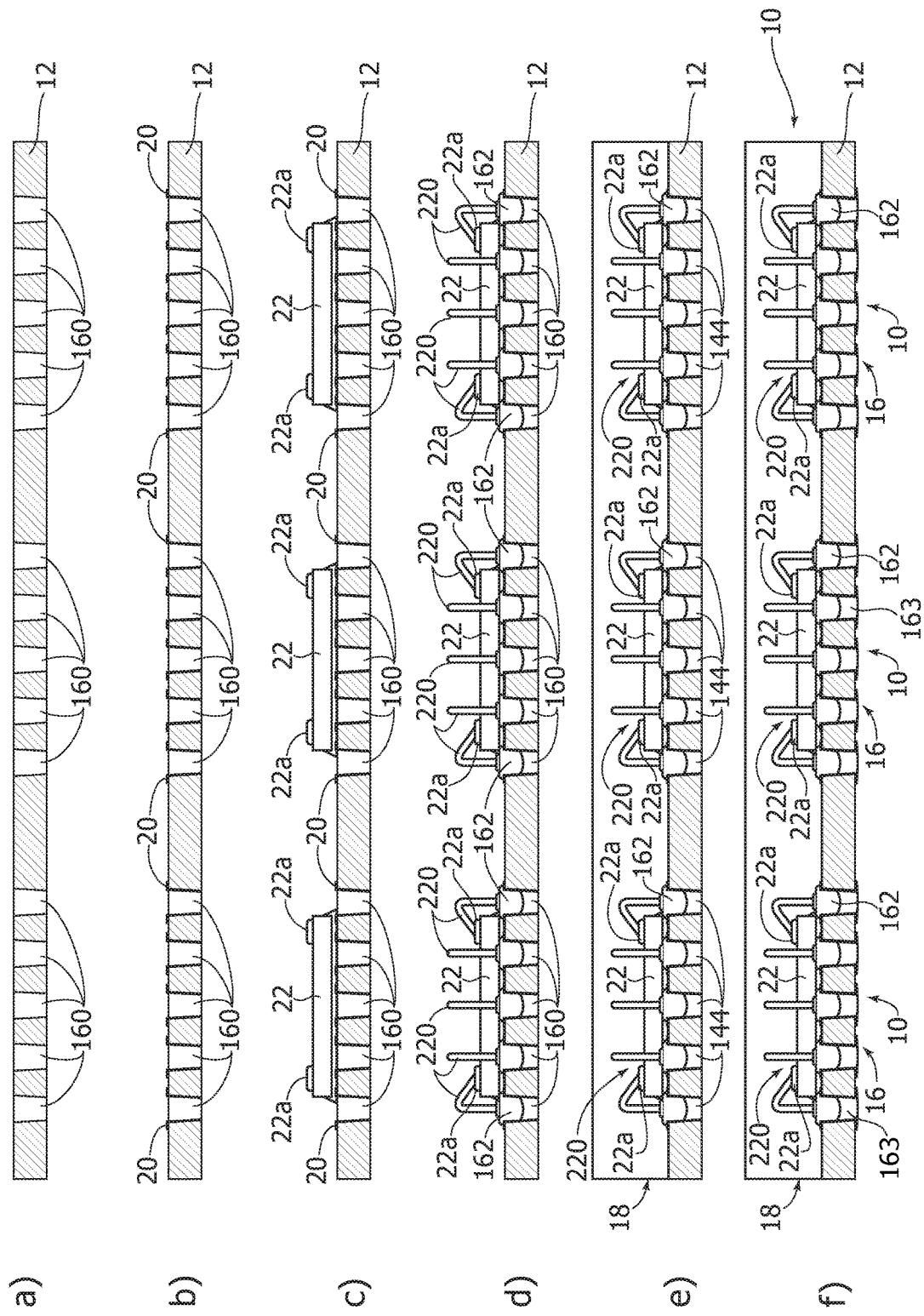

Portion a) of FIG. 10 is essentially a cross-section view along line X-X of FIG. 9 illustrative of the provision of (e.g., frusto-conical) holes 160 formed by laser ablation (LDS processing) and electroless metal (e.g., Cu) plating (as shown in portion b) which facilitate to create electrically-conductive formations (tracks or traces) 20 in electrical contact with the inner surfaces of the holes 160.

A die attach step may follow as schematically represented in portion c) of FIG. 10. That is, a semiconductor die is coupled to a central portion of the top or from surface of the substrate 12.

Portion d) of FIG. 10 is exemplary of electrically-conductive (e.g., copper) balls inserted into the holes 160 to form the studs 162 with a wire-bonding layout 220 provided to facilitate electrical contact between the studs 162 and bond pads 22a. In one or more embodiments, the wire-bonding layout 220 may be provided as "reverse" bonding with the first bond provided with the balls 162 partially inserted in the metallized vias (holes 160).

Portions e) and f) of FIG. 10 are exemplary of the possible completion of the product 10 by form a package 18 molded (in any conventional manner known for that purpose) and filling spaces 144 of the holes 160 opposed to the ends of the holes 160 where the balls 162 where inserted (see, e.g., spaces 144 in FIG. 5) via deposition of an electrically/thermally conductive material 163 (e.g., metal such as copper) via electroplating, which may result in the formation of electrical contact pads such as the pads 16 visible in FIG. 2.

Individual semiconductor products (e.g., nine semiconductor packages if the exemplary layout shown in FIG. 9 is adopted for the substrate 12) may then be obtained via a standard singulation step (not visible in the figures).

As noted, in an arrangement as exemplified in FIG. 10 the chip or die 22 may be provided with die pads 22a (e.g., in the form of the stud bumps) adapted to constitute the surface where the second bond is provided during reverse bonding to produce the wire-bonding layout 220. Bonding may thus be provided first on the balls 162 inserted in the (frusto-conical) vias or holes 160 with subsequent wire stitching on die pads 22a on the die or chip 22.

The package 18—see e.g. portion e) of FIG. 10—may encapsulate the whole arrangement with leaking (bleeding) of the molding compound via the holes 160 countered by the corresponding vias being "plugged" by the balls forming the stud bumps 162.

The implementing options exemplified in FIGS. 9 and 10 provide a frame-less QFN-like package with a plastic substrate 12. In such an arrangement a conventional frame is replaced by the substrate 12 provided with (frusto-conical) plugged metalized vias, e.g., through laser ablation and electroless plating. Also (reverse) wire-bonding is realized with the balls 162 inserted in the holes 160, with the balls 162 also capable of countering package leak-out through the substrate 12. Time and cost of completing vias filling, e.g., to provide external pins (see, e.g., 16 in FIG. 2) are also reduced.

Figure 11:
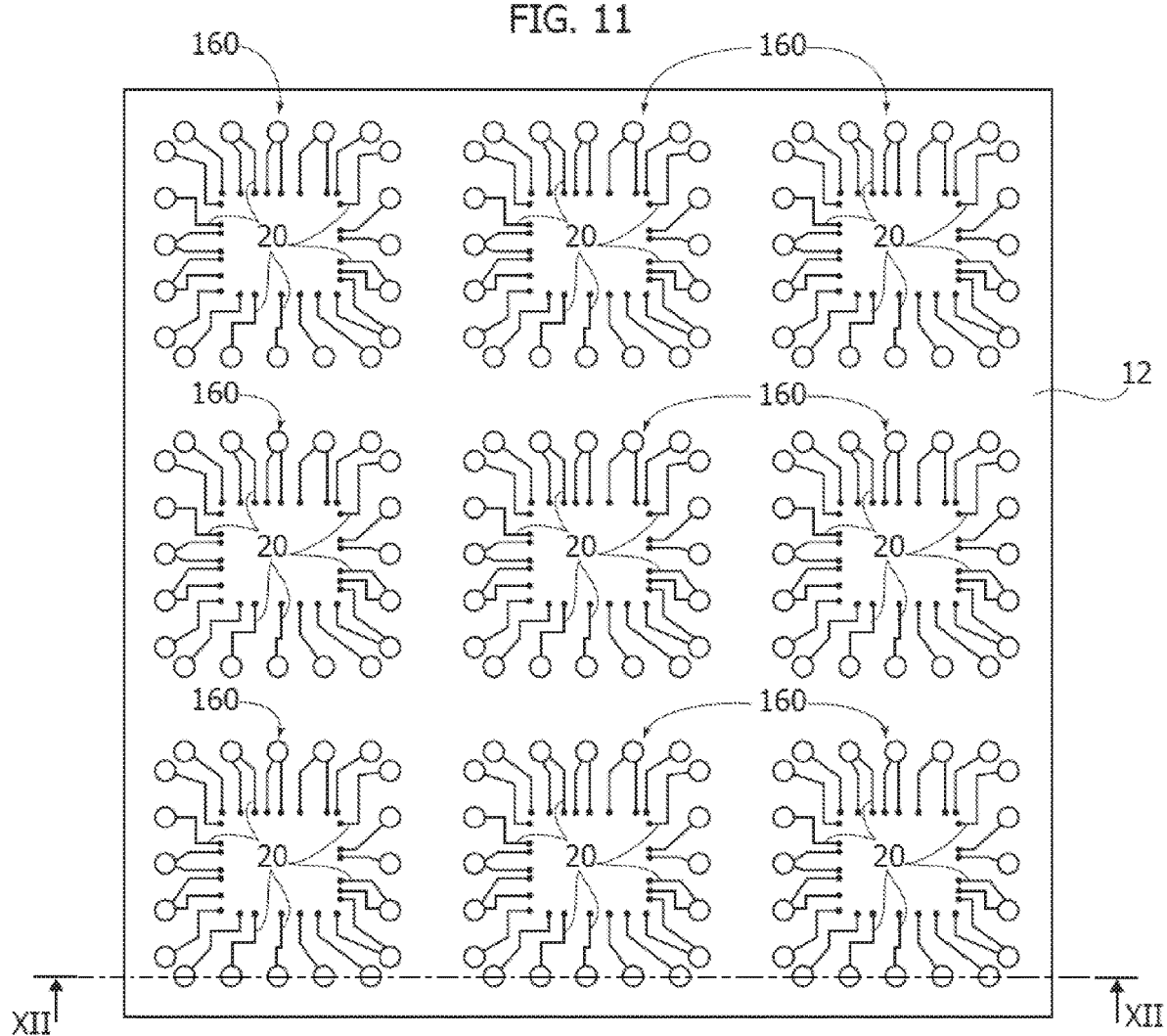
FIG. 11 is a plan view of another substrate in accordance with one embodiment, FIG. 12 includes seven portions, designated a), b), c), d), e), f) and g), exemplary of possible steps of assembling a semiconductor package using the substrate of FIG. 11 according to one embodiment and represented in cross-sectional views substantially corresponding to line XII-XII of FIG. 11.
Figure 12:
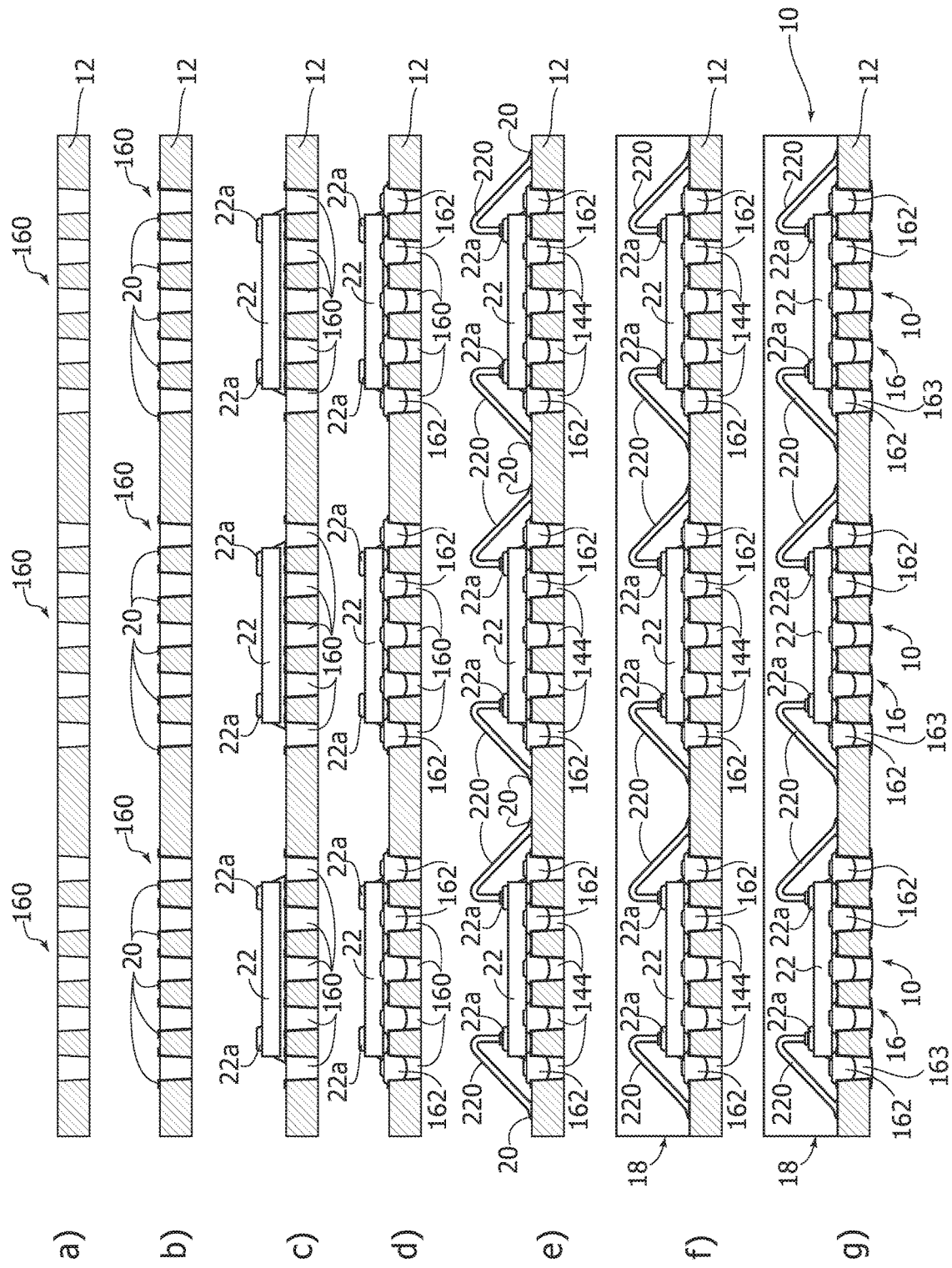

FIGS. 11 and 12 exemplify one or more embodiments which may include certain variants over the embodiments exemplified in FIGS. 9 and 10. For the sake of brevity, parts or elements like parts or elements already discussed in connection with FIGS. 9 and 10 are indicated with like numerals in FIGS. 11 and 12: a corresponding detailed description will not be repeated for the sake of brevity. It will be otherwise understood that features exemplified in any one of the annexed figures may be applied, singly or in combination, also to embodiments exemplified in any other one of the figures.

Essentially, the steps exemplified in portions a, b and c of FIG. 12 correspond to the steps exemplified in figure a), b) and c) of FIG. 10, respectively.

Also, the plan view of FIG. 11 essentially represents the substrate 12 after laser ablation and routing metallization (track or traces 20), that is in a condition corresponding to portion b) of FIG. 12.

In embodiments as exemplified in FIGS. 11 and 12, the wire-bonding layout 220 can be provided as exemplified in portions d) and e) of FIG. 12, namely as standard bonding between the die pads 22a and corresponding pads provided (e.g., via laser ablation and plating) at the front (top) surface of the substrate 12 thereby providing electrical connection to the traces or tracks 20.

In embodiments as exemplified in FIGS. 11 and 12, metal balls 162 are again inserted into the (frusto-conical) holes 160 to fill the corresponding vias. These are again partially filled by the balls/bumps thus reducing the total volumes (see again 144 in FIG. 5) filled with metal. This again reduces any associated process step duration (e.g., plating) and consumption of material and chemicals.

Here again, the balls/bumps 162 will counter undesired leakage (bleeding) of the package compound 18 through the vias defined by the holes 160, with the bumps 162 and the associated metallization adapted to act (at least) as thermal vias facilitating thermal dissipation through the substrate 12.

As noted, other than for what has been specifically discussed here, the description provided in respect of FIGS. 9 and 10 applies mutatis-mutandis also to FIGS. 11 and 12. For instance, the various individual semiconductor products resulting from the steps a) to g) in FIG. 12 may be separated via a standard singulation step (not visible in the figures).

Figure 13:
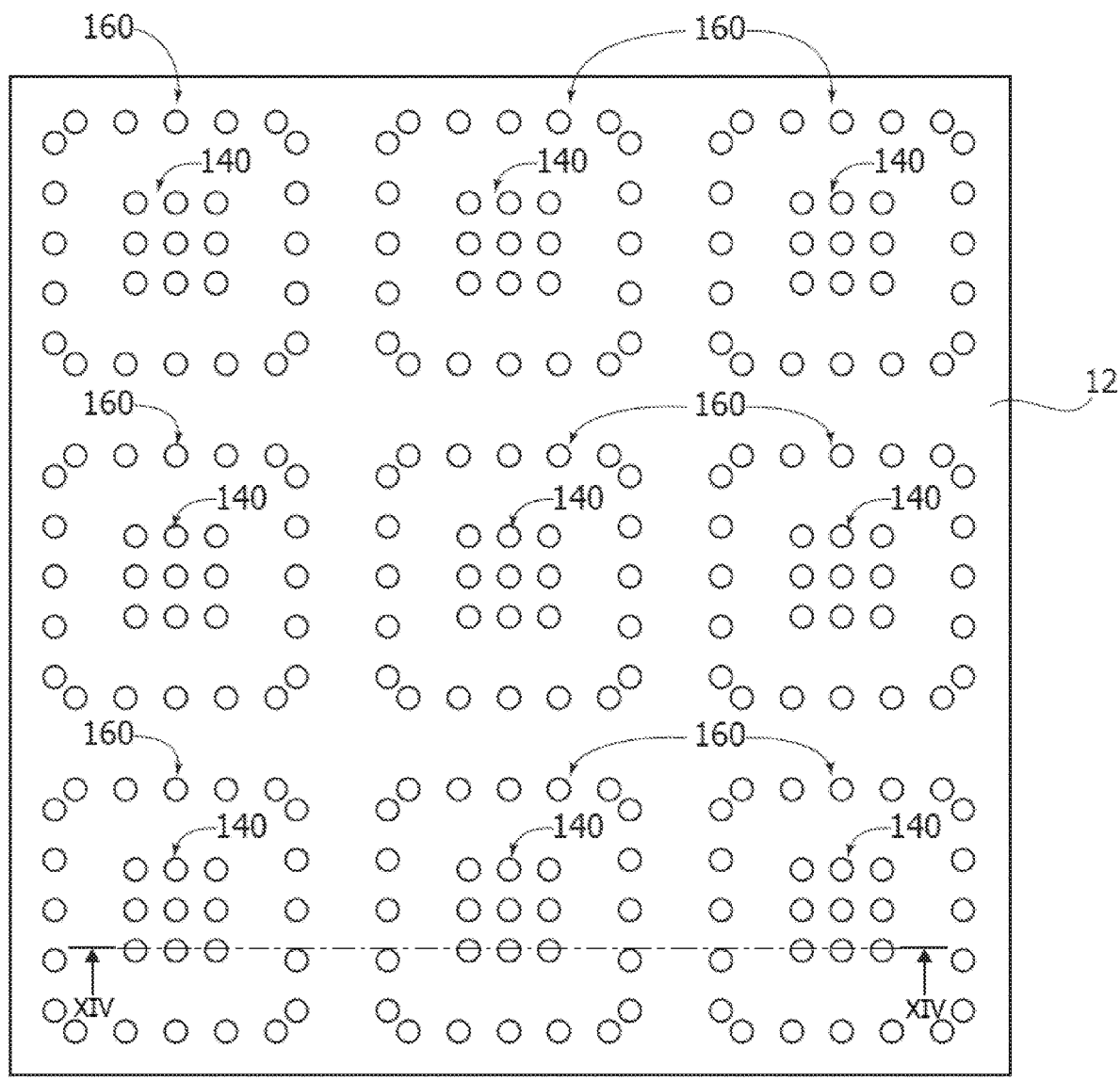
FIG. 13 is a plan view of another substrate in accordance with one embodiment.

FIG. 13 is further exemplary of the fact that parts, elements and, more generally, features, discussed in connection with any one of the figures may be applied, in one or more embodiments, also to embodiments exemplified in any other of the figures. For instance, FIG. 13 exemplifies the possibility of employing a substrate 12 including a matrix-like arrangement of hole patterns (e.g., 3×3, like those exemplified in FIGS. 9 and 11) including for each pattern both (frusto-conical) holes 140 and (similarly frusto-conical) holes 160, located centrally and peripherally of each pattern.

FIG. 14 exemplifies (according to a notional view along line XIV-XIV of FIG. 13) a set of a centrally-located holes 140 intended to receive respective balls or bumps 142 (see FIGS. 14 and 15) with a semiconductor chip or die 22 arranged thereon.

As exemplified in the enlarged view of FIG. 15 the thermally (and electrically) conductive bumps 142 in contact with the thermally (and electrically) conductive surface of the holes 140 (e.g., as resulting from ablation and plating as exemplified by 20) plus the filling of the spaces 144 (possibly again via electro plating of, e.g., thermally conductive material such as copper) makes it possible to provide a heat sink 14 to facilitate removal of heat produced during operation by a semiconductor chip or die 22 attached on top of the bumps 142.

While exemplified for completeness of explanation and understanding, various processing steps discussed herein are not mandatory and may not be included in one or more embodiments. Just by way of (non-limiting) example, a molded package 18 may not be included in one or more embodiments.

One or more embodiments can thus make use of standard bonding and bumps not connected with silicon, with balls ("inserted" in the metallized vias to produce a first ball bonding) adapted to act as a "stopper" during package molding and to provide a joint which may be welded, e.g., via thermo-compression plus ultrasound.

In one or more embodiments, the external contacts of the package can be provided by electroplating, e.g., by progressively filling the empty portions of the vias.

While certain applications may have the ability to adapt to mounting on flexible or curved surfaces, one or more embodiments may adopt "thick" silicon, so that rigid supports to recover excessive warping during assembly can be dispensed with.

One or more embodiments may be adapted for automotive applications with lower costs in comparison with conventional QFN solutions, with the possibility of avoiding flip-chip solutions, e.g., by resorting to standard or reverse wire bonding.

In one or more embodiments, a product (e.g., 10) may include:

a laminar plastic substrate (e.g., 12) having first and second opposed surfaces and through holes (e.g., 140, 160) extending through the substrate, electrically and/or thermally conductive material balls (e.g., 142, 162) inserted in the through holes at the first surface of the substrate, and at least one semiconductor chip (e.g., 22) mounted at the first surface of the substrate, the at least one semiconductor chip electrically (e.g., 22a) and/or thermally (see, e.g., FIG. 15) coupled with electrically and/or thermally conductive material balls inserted in the through holes.

One or more embodiments may include electrically and/or thermally conductive material applied (e.g., electro-plated) to the second surface of the substrate and partially filling (e.g., 144) through holes in the substrate.

In one or more embodiments, the through holes in the substrate may include frusto-conical holes tapering from the first surface towards the second surface of the substrate.

One or more embodiments may include electrically-conductive formations (e.g., 20) extending at the first surface of the substrate in electrical contact (e.g., 220) with respective ones of said balls inserted in through holes in the substrate.

In one or more embodiments:
the at least one semiconductor chip may include electrical contact pads (e.g., 22a),
a wire-bonding layout (e.g., 220) is provided between the electrical contact pads of at least one semiconductor chip, and:
  i) respective ones of said balls inserted in through holes in the substrate—see, e.g., FIG. 10, portions d) ti f), and/or
  ii) electrically-conductive formations at the first surface of the substrate—see, e.g., FIG. 12, portions e) to g).

One or more embodiments may include through holes having electrically and/or thermally conductive hole surfaces.

In one or more embodiments, the substrate may include laser direct structuring (LDS) material laser activated ("ablated") to provide electrically and/or thermally conductive formations.

One or more embodiments may include package material (e.g., 18) applied onto the first surface of the substrate, the package material encapsulating the at least one semiconductor chip with the through holes through the substrate having said balls inserted (as "plugs") therein exempt from package material penetrated into said through holes.

In one or more embodiments, a method may include:
providing a laminar plastic substrate having first and second opposed surfaces and through holes extending through the substrate,
inserting electrically and/or thermally conductive material balls in the through holes at the first surface of the substrate, and
mounting at least one semiconductor chip at the first surface of the substrate, the at least one semiconductor chip electrically and/or thermally coupled with electrically and/or thermally conductive material balls inserted in the through holes.

One or more embodiments may include providing the at least one semiconductor chip with electrical connection die pads, and
  i) providing a (reverse) wire-bonding layout from respective ones of said balls inserted in through holes in the substrate to the die pads, or
  ii) providing a wire-bonding layout between the die pads and electrically-conductive formations at the first surface of the substrate.

Without prejudice to the underlying principles, the details and embodiments may vary, even significantly, with respect to what has been described by way of example only, without departing from the extent of protection.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A product, comprising:
  a plastic substrate having first and second opposed surfaces and through holes extending through the substrate between the first and second surfaces, the substrate including a laser direct structuring material and having laser activated conductive walls on walls of the through holes;
  conductive balls inserted partially in the through holes at the first surface of the substrate, the conductive balls coupled to surfaces of the conductive walls; and
  at least one semiconductor chip coupled to the first surface of the substrate and the conductive balls.

2. The product of claim 1, further comprising conductive material on the second surface of the substrate and partially filling through holes in the substrate.

3. The product of claim 2, wherein the conductive material on the second surface of the substrate and partially filling the through holes is coupled to the conductive balls inserted in the through holes at the first surface.

4. The product of claim 1, further comprising electrically-conductive formations at the first surface of the substrate, the electrically-conductive formations in electrical contact with the conductive balls inserted in through holes in the substrate at the first surface.

5. The product of claim 1, wherein the at least one semiconductor chip coupled to the first surface of the substrate is coupled to the conductive balls by wire bonds.

6. The product of claim 1, further comprising package material on the first surface of the substrate, the package material encapsulating the at least one semiconductor chip.

7. The product of claim 1, wherein the through holes in the substrate are frusto-conical holes tapering from the first surface towards the second surface of the substrate.

8. A method, comprising:
  laser activating a substrate to form a plurality of through holes with conductive walls;
  inserting conductive balls in the through holes at a first surface of the substrate, the conductive balls being in contact with the conductive material on the walls of the substrate;
  mounting at least one semiconductor chip at the first surface of the substrate; and
  electrically coupling the at least one semiconductor chip to the conductive balls inserted in the through holes.

9. The method of claim 8, further comprising depositing conductive material in the through holes at a second surface of the substrate.

10. The method of claim 9 wherein depositing the conductive material in the through holes at the second surface further includes depositing the conductive material on the second surface of the substrate between the through holes and forming a heat sink.

11. The method of claim 9, wherein electrically coupling the at least one semiconductor chip to conductive balls comprises coupling first ends of conductive wires to the conductive balls inserted in the second set of through holes, respectively, and second ends of the conductive wires to die pads of the at least one semiconductor chip.

12. The method of claim 11, further comprising forming a package around the at least one semiconductor chip and the conductive wires and on the first surface of the substrate.

13. The method of claim 8, wherein the through holes includes a first set of through holes and a second set of through holes, wherein mounting the at least one semiconductor chip at the first surface of the substrate includes mounting the at least one semiconductor chip to the first set of through holes.

14. The method of claim 8, wherein inserting conductive balls in the through holes comprises inserting the conductive balls partially in the through holes.

15. A semiconductor package, comprising:
- a substrate having a first surface, a second surface opposite the first surface, and a first set of through holes and a second set of through holes, the substrate including a laser direct structuring material and laser activated conductive walls in the first and second through holes;
- a first conductive material partially in the first and second sets of through holes at the first surface of the substrate; and
- a semiconductor chip coupled to the first surface of the substrate and electrically coupled to the first conductive material in the first and second sets of through holes.

16. The semiconductor package of claim 15 wherein the first set of through holes are at a perimeter portion of the substrate and the second set of through holes are at a center portion of the substrate below the semiconductor chip.

17. The semiconductor package of claim 16, wherein the semiconductor chip is coupled to the first set of through holes by conductive wires have first ends coupled to bond pads of the semiconductor chip and second ends coupled to conductive pads on the first surface of the substrate or the first set of through holes.

18. The semiconductor package of claim 17, further comprising a second conductive material in the first and second sets of through holes at the second surface, the second conductive material also located on the second surface around the first set of through holes to form lands, the second conductive material also located on the second surface between the second set of through holes to form a heat sink.

19. The semiconductor package of claim 17, further comprising a package material over the first surface of the substrate and around the semiconductor chip.

20. The semiconductor package of claim 15, wherein the first conductive material is both thermally and electrically conductive.

* * * * *